US011906901B2

(12) United States Patent
Goldfarb et al.

(10) Patent No.: US 11,906,901 B2
(45) Date of Patent: Feb. 20, 2024

(54) ALTERNATING COPOLYMER CHAIN SCISSION PHOTORESISTS

(71) Applicant: International Business Machines Corporation, Armonk, NY (US)

(72) Inventors: Dario Goldfarb, Dobbs Ferry, NY (US); Ekmini Anuja De Silva, Slingerlands, NY (US); Jing Guo, Niskayuna, NY (US); Jennifer Church, Albany, NY (US); Luciana Meli, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 17/340,300

(22) Filed: Jun. 7, 2021

(65) Prior Publication Data

US 2022/0390845 A1 Dec. 8, 2022

(51) Int. Cl.
*G03F 7/004* (2006.01)
*G03F 7/039* (2006.01)
*G03F 7/20* (2006.01)

(52) U.S. Cl.
CPC .......... *G03F 7/0392* (2013.01); *G03F 7/0042* (2013.01); *G03F 7/0043* (2013.01); *G03F 7/2004* (2013.01)

(58) Field of Classification Search
CPC ..... G03F 7/0042; G03F 7/0045; G03F 7/0392
See application file for complete search history.

(56) References Cited

U.S. PATENT DOCUMENTS

| | | | |
|---|---|---|---|
| 3,945,981 | A | 3/1976 | Robertson |
| 4,001,350 | A | 1/1977 | Fahrbach et al. |
| 4,220,707 | A | 9/1980 | Ohmura et al. |
| 5,128,429 | A | 7/1992 | Towle et al. |
| 7,026,099 | B2 | 4/2006 | Kato et al. |
| 7,687,582 | B1 | 3/2010 | Luebben et al. |
| 8,597,873 | B2 | 12/2013 | Kawamura |
| 9,086,625 | B2 | 7/2015 | Hatakeyama et al. |
| 9,815,930 | B2 | 11/2017 | Thackeray et al. |
| 2004/0010108 | A1 | 1/2004 | Bianconi et al. |
| 2004/0265745 | A1 | 12/2004 | Sho et al. |
| 2015/0253660 | A1 | 9/2015 | Ojima |
| 2020/0050109 | A1* | 2/2020 | Ho ................ H01L 21/0274 |
| 2020/0348591 | A1* | 11/2020 | Kim ................ G03F 7/0042 |
| 2021/0026241 | A1 | 1/2021 | Cardineau et al. |
| 2021/0109442 | A1* | 4/2021 | Moon .............. H01L 21/0274 |

FOREIGN PATENT DOCUMENTS

| | | | | |
|---|---|---|---|---|
| JP | 2001072716 | * | 3/2001 | ........... G03F 7/0042 |
| WO | 2005077987 | W | 8/2005 | |
| WO | 2018004551 | A1 | 1/2018 | |
| WO | WO-2021099051 | A1 * | 5/2021 | ........... G03F 7/0042 |
| WO | 2022259060 | A1 | 12/2022 | |

OTHER PUBLICATIONS

Fukunaga et al., "Synthesis and Property of Tellurim-Containing Polymer for Extreme Ultraviolet Resist Material," Journal of Photopolymer Science and Technology, vol. 30, No. 1 (2017) 103-107 © 2017SPST.
Harrypersad et al., "Alternating Polystannanes: Syntheses and Properties," Chem. Commun., 2015, 51, pp. 7120-7123.
Kudo et al., "Synthesis and Property of Tellurim-Containing Molecular Resist Materials for Extreme Ultraviolet Lithography System," Journal of Photopolymer Science and Technology, vol. 32, No. 6 (2019) 805-810, © 2019SPST.
Roner et al., "Control of breast cancer using metal-containing polymers based on cell line results," https://meddocsonline.org/annals-of-breast-cancer/control-of-breast-cancer-using-metal-containing-polymers-based-on-cell-line-results.html, Annals of Breast Cancer, published online Aug. 8, 2018, 9 pgs.
Sitterly et al., Molecular organometallic resists for EUV (MORE): Reactivity as a function of metal center (Bi, Sb, Te and Sn), Mar. 27, 2018, https://www.spiedigitallibrary.org/conference-proceedings-of-spie/10586/105861P/Molecular-organometallic-resists-for-EUV-MORE-Reactivity-as-a/10.1117/12.2316333.short?SSO=1, 4 pgs. (abstract only).
Adams et al., "Polystannanes Ph3Sn(tert-Bu2Sn)nSnPh3 (n=1-4): A Route to molecular metals," Dec. 31, 1987, No. 12, vol. 26, 2 pgs.
Creemers et al., "Studies in Group IV Organometallic Chemistry XXII. Synthesis Of Tin-Germanium Compounds by Hydrogenolytic Fission of Metal(IV)-Nitrogen Bonds," Journal of Organmetallic Chemistry, Elsevieer Publishing Company Amsterdamn, May 4, 1966, pp. 237-247.
Harrypersad et al., "Linear Oligostannanes: A Synthetic and TD-DFT Study," J Inorg Organomet Polym (2015) 25:515-528, DOI 10.1007/s10904-015-0221-6, Apr. 12, 2015.
International Search Report and Written Opinion, International Application No. PCT/IB2022/054485, dated Aug. 29, 2022, 9 pgs.
Neumann et al., "Preparation and Structure of Diphenyltin," Angewandte Chemie, Dec. 31, 1962, No. 4, vol. 1, 4 pgs.
Sommer et al., "Eine Synthese von organischen Tri-und Tetrastannanen," https://chemistry-europe.onlinelibrary.wiley.com/doi/10.1002/jlac.19666920103, Organozinnverbindungen Dec. 31, 1966, vol. 692, 11 pgs.

* cited by examiner

*Primary Examiner* — John S Chu
(74) *Attorney, Agent, or Firm* — Kelsey M. Skodje (57) ABSTRACT

Alternating copolymers having hydrocarbon-substituted terminal units and repeat units each containing two different monomer units with extreme ultraviolet (EUV)-absorbing elements are disclosed. Alternating copolymers having organic terminal units and repeat units each containing a monomer unit with an EUV-absorbing element and an organic monomer unit are also disclosed. A process of forming a polymer resist, which includes providing an alternating copolymer having repeat units with at least one EUV-absorbing monomer unit and replacing end groups of the alternating copolymer with unreactive terminal units, is disclosed as well.

9 Claims, 4 Drawing Sheets

ALTERNATING COPOLYMER CHAIN SCISSION PHOTORESISTS

BACKGROUND

The present disclosure relates to photolithographic materials and, more specifically, photopolymer resists.

Extreme ultraviolet (EUV) lithography is a microfabrication technique that employs EUV light (e.g., λ=about 13.5 nm) to transfer an integrated circuit pattern onto a light-sensitive polymeric material called a photoresist or resist. The patterned resist is then used in an etching process to transfer the pattern onto a semiconductor wafer. Because EUV lithography uses a shorter wavelength of light than traditional photolithography, higher resolution patterning can be achieved. Increasing the numerical aperture (NA) of the EUV light source can provide even higher resolution. As the resolution increases, stochastic effects due to resist material irregularities can have a greater impact on patterning success.

SUMMARY

Various embodiments are directed to a polymer having hydrocarbon-substituted terminal units and repeat units each containing two different monomer units with extreme ultraviolet (EUV)-absorbing elements. The polymer has the structure:

wherein x=2 or 3, A is an EUV-absorbing element, R', R", and R'" are each hydrocarbon ligands, and n is an integer greater than 1. A can be Sn, Te, Bi, or Sb. In some embodiments, R is not the same species of hydrocarbon as R'. In some embodiments, R" is the same hydrocarbon species as R' and/or R. Further, R and/or R" can be the same species of hydrocarbon as R'". In some embodiments, the polymer has a number average molecular weight of at least 10,000 Da-100,000 Da.

Additional embodiments are directed to polymers having organic terminal units and repeat units each containing a monomer unit with an EUV-absorbing element and an organic monomer unit. The polymer has the structure:

wherein x=2 or 3, A is an EUV-absorbing element, R is a hydrocarbon ligand, E is an organic monomer unit, E' is a non-functional terminal unit, and n is an integer greater than 1. A can be Sn, Te, Bi, or Sb. In some embodiments, E and E' each include an ether linking group. In other embodiments, E and E' each include an ester linking group. The polymer can have a number average molecular weight of at least 10,000 Da-100,000 Da.

Further embodiments are directed to a process of forming a polymer resist. The process includes providing an alternating copolymer having repeat units with at least one EUV-absorbing monomer unit and replacing end groups of the alternating copolymer with unreactive terminal units. Replacing the end groups can include reacting the alternating copolymer with monofunctional monomers. In some embodiments, providing the alternating copolymer includes polymerizing two different species of difunctional EUV-absorbing monomers. In other embodiments, the providing the alternating copolymer includes polymerizing a difunctional EUV-absorbing monomer and a difunctional organic monomer, such as a diol or a dicarboxylic acid.

The process can also include applying the polymer resist on a substrate and lithographically patterning the polymer resist.

DETAILED DESCRIPTION

Photolithography is a technique commonly used in semiconductor fabrication to etch integrated circuit patterns onto semiconducting wafers. Photolithographic patterning involves coating a base material with a photosensitive resist material, which is referred to herein as a photoresist or resist. The resist is selectively masked by a photomask that is designed with the integrated circuit pattern. When unmasked regions of the resist are exposed to a light source (e.g., visible light, ultraviolet (UV) light, and/or extreme ultraviolet (EUV) light), a chemical reaction occurs so that selected sections of the photoresist are dissolvable in a developer, and therefore removable during the development stage in the lithographic process.

Photoresists can be categorized as positive or negative. When exposed to a light source, the unmasked regions of a negative resist become insoluble, e.g., by light-triggered polymerization or cross-linking. In contrast, unmasked sections of a positive resist photosolubilize upon exposure to a light source. For example, a positive photopolymer resist can undergo chain scission upon photon absorption. Removing the dissolvable sections during the development stage creates the patterned resist, which is used to transfer the pattern to the semiconductor or other substrate materials during subsequent etching steps.

Traditional photolithography has used visible and/or UV light (e.g., about 193 nm-436 nm) as photon sources, but these wavelengths are too long for the high resolution patterning required for much of today's technology. EUV lithography employs light in the 10-124 nm (EUV) region. For high-resolution patterning in semiconductor fabrication an EUV wavelength of about 10-13.5 nm, generated by a laser-driven tin (Sn) plasma source, is often used. Additionally, next-generation techniques such as multi-patterning and high numerical aperture (NA) EUV lithography are being developed to provide even higher resolutions. EUV lithography typically uses a light source with an NA of 0.33 to obtain about 13 nm resolution, while high NA EUV lithography can use a 0.55 NA light source. While this can allow smaller pattern dimensions, it introduces various challenges.

For example, the impact of stochastic effects due to material variability is increased. Lacking a pellicle at these dimensions, and more being vulnerable to pattern disruption, this type of resist can require a reduced exposure area, e.g., using a darkfield reticle and positive tone resist. However, most next-generation resists developed for high NA EUV lithography are negative resists, and the positive resists generally require additional chemical amplifiers (e.g., a photo-acid generator (PAG), photon-decomposable base (PDB), etc.). Thus, there is a need for positive photoresists with improved compositional uniformity that do not require minority components, such as chemical amplifiers.

Disclosed herein are techniques for producing positive resists with reduced compositional variability. The resists employ alternating copolymers that include monomer units containing elements that absorb EUV radiation ("EUV-absorbing elements"). For example, the alternating copolymers can be poly(stannanes). Absorption of EUV radiation causes chain scission, solubilizing the unmasked regions of the resist without requiring minority components such as chemical amplifiers, catalysts, etc. The use of copolymers allows greater control over resist properties by varying the structure and reactivity of monomer units. The polymerization methods used to form the resists avoid random distribution of units, which can lead to material variability. Additionally, the polymer resist chains can be terminated at controlled lengths by replacing the alternating copolymer's functional end groups with unreactive terminal units.

Figure 1A:
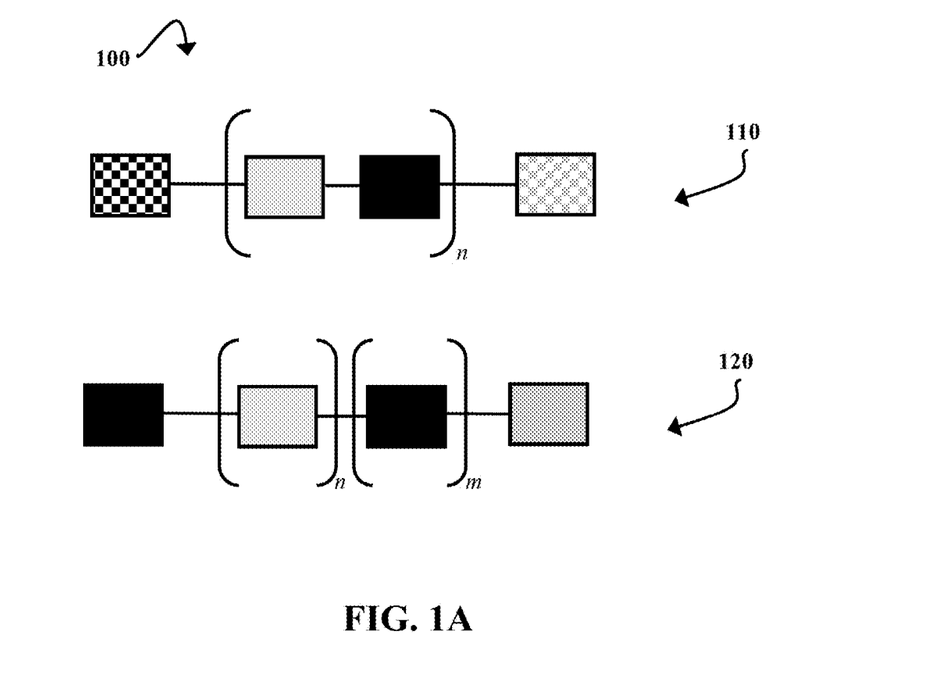
FIG. 1A is a block structure diagram illustrating an alternating copolymer and a random copolymer, according to some embodiments of the present disclosure.

FIG. 1A is a block structure diagram 100 illustrating an alternating copolymer 110 and a random copolymer 120, according to some embodiments of the present disclosure. Herein, "alternating copolymer" refers to a strictly alternating copolymer, which can also be described as a homopolymer with repeat units containing more than one species of monomer ("monomer units"). Copolymers that include adjacent repeat units of the same monomer species in addition to alternating repeat units are referred to as "random copolymers" herein.

Alternating copolymer 110 includes n repeat units, each containing two different monomer units (respectively represented by the gray and black squares). Random copolymer 120 includes n repeat units of a first monomer (gray square) and m repeat units of a second monomer (black square). Herein, the subscripts n and m can each refer to any integer greater than 1 unless specified otherwise. The length of the polymer chains can vary based on the desired application and resist properties. In some embodiments, the number average molecular weight of alternating copolymer 110 is greater than or equal to about 100,000 Da (g/mol). However, the average molecular weights of alternating copolymer 110 and/or random copolymer 120 can, in some embodiments, be within a range of at least 10,000 Da-100,000 Da, 400 Da to 10,000,000 Da, etc.

At least one of the monomer units of alternating copolymer 110 includes an element that absorbs EUV radiation. These can be elements that highly absorb EUV radiation. For example, one or both monomer units can contain an atom of tin (Sn), antimony (Sb), tellurium (Te), or bismuth (Bi). An element that highly absorbs EUV radiation can have an EUV photoabsorption cross-section equal to or greater than $10^7$ cm$^2$/mol. The EUV-absorbing monomer units can be derived from polymerization of difunctional EUV-absorbing monomers, such as diaryl- or dialkylstannanes. In some embodiments, one of the monomers is an organic monomer unit derived from a condensation polymerization reaction between a difunctional EUV-absorbing monomer and a difunctional organic monomer such as a diol or dicarboxylic acid monomer.

Random copolymer 120 has functional groups corresponding to its monomer repeat units (gray and black boxes) at each end of the chain ("functional end groups" or "live ends"). In contrast, alternating copolymer 110 includes terminal units (gray and black checked boxes), which have unreactive alkyl and/or aryl moieties that are intended to prevent further polymerization or crosslinking. Herein, "unreactive" refers to species without functional groups available for further reactions such as cyclization, branching, crosslinking, etc. (e.g., functional end groups).

Figure 1B:
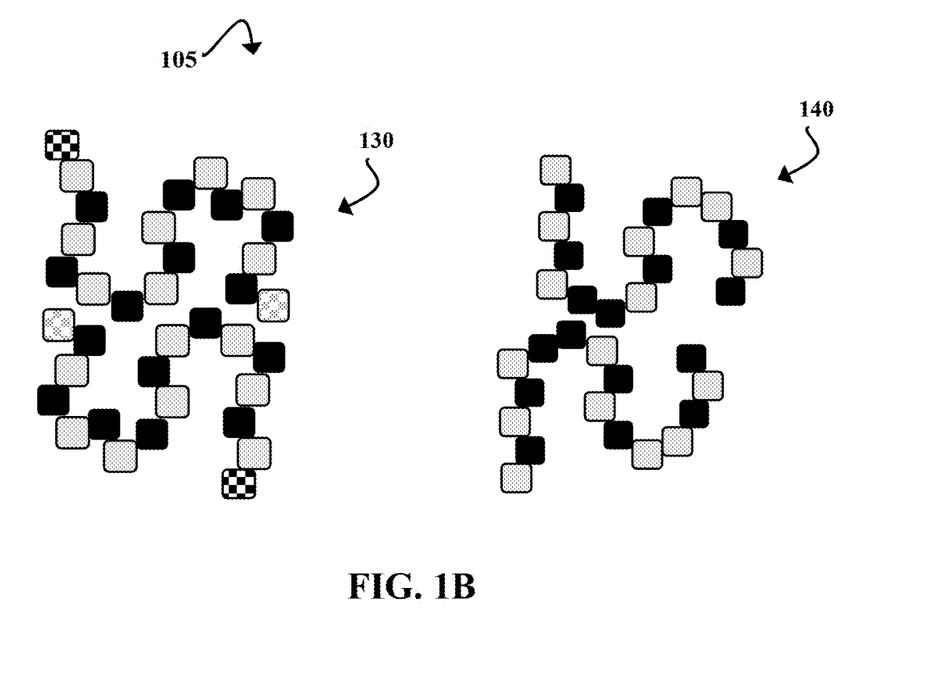
FIG. 1B is a block structure diagram illustrating polymer resist conformations, according to some embodiments of the present disclosure.

FIG. 1B is a block structure diagram 105 illustrating polymer resist conformations, according to some embodiments of the present disclosure. Polymer resist 130 is an alternating copolymer, and polymer resist 140 is a random copolymer. In both polymer resists 130 and 140, the gray and black squares represent different monomer units. The striped and checked boxes on each chain of polymer resist 130 represent unreactive terminal units. Polymer resist 130 can be an example of alternating copolymer 110 (FIG. 1A) deposited on a substrate (not shown) in some embodiments. Similarly, polymer resist 140 can be an example of random copolymer 120 (FIG. 1A) deposited on a substrate (not shown).

The two monomer species of polymer resist 140 can be the same as the monomer species of polymer resist 130, but the polymer resists 130 and 140 can also have different monomer species. The number, length, shape, relative size, etc. of polymer chains in FIG. 1B are for the purposes of illustrating conformational structures and should not be interpreted as actual resist compositions. For example, resists can have any number of polymer chains with any suitable number of monomers. This can depend upon factors such as molecular weight of the polymer, reactivity of the polymer, area and thickness of the resist, etc. While alternating and random copolymers with more than two monomer species are not illustrated in FIG. 1B, these can have conformational differences substantially similar to those of polymer resists 130 and 140.

Polymer resist 130 has a more ordered conformation than polymer resist 140. The chain lengths of polymer resist 130 can be controlled via addition of terminal units. This is described in greater detail below. Further, the unreactive terminal units can prevent future inter-chain reactions (e.g., cyclization) that may reduce the stability and structural consistency of polymer resist 130. In contrast, the chains of polymer resist 140 end with functional groups that can participate in further polymerization, cyclization, crosslinking, etc. The strictly alternating monomers and consistent chain lengths of polymer resist 130 can provide a more ordered resist structure than the random distribution of monomers in polymer resist 140. For example, polymer resist 130 avoids the blockiness present in polymer resist 140. Blockiness refers to an adjacency of co-monomers greater than their statistical distribution. This can cause conformational variations in a polymer, leading to uneven spatial distribution of elements that highly absorb EUV radiation, which would result in local spatial variability of EUV resist sensitivity, therefore increasing the risk of stochastic defectivity. The more ordered structure of polymer resist 130 can increase the efficiency of EUV absorption and reduce stochastic errors.

Figure 2:
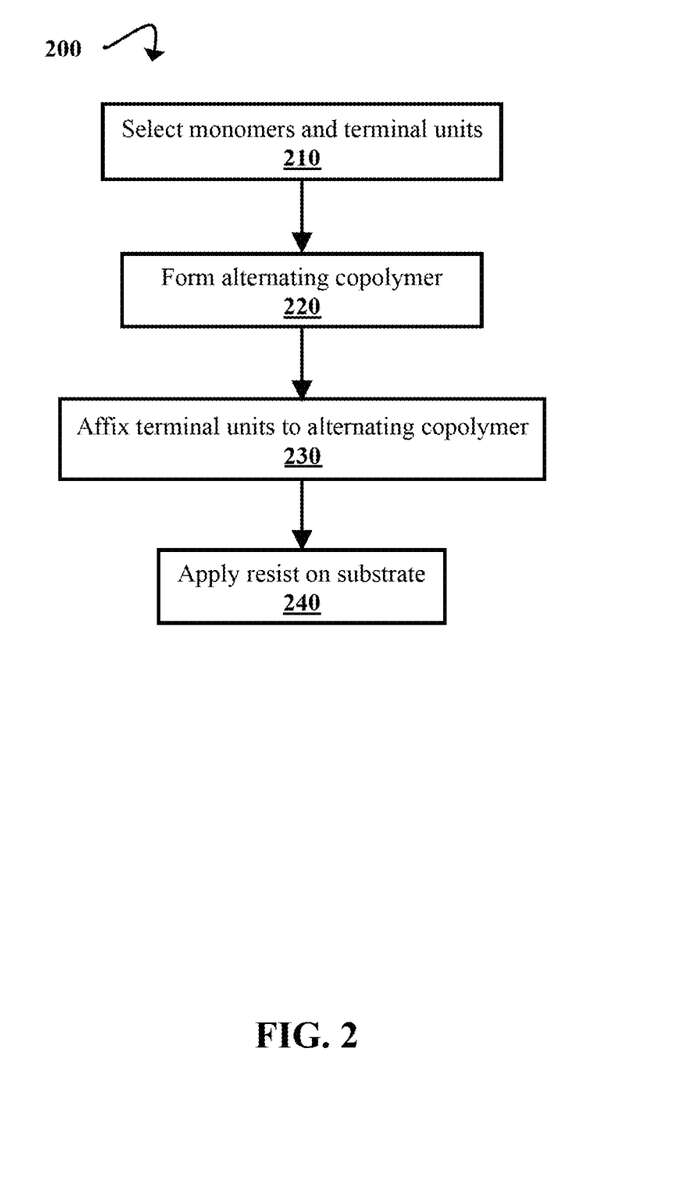
FIG. 2 is a flow diagram illustrating a process of forming a polymer resist, according to some embodiments of the present disclosure.

FIG. 2 is a flow diagram illustrating a process 200 of forming a polymer resist, according to some embodiments of the present disclosure. Monomer species and terminal units are selected. This is illustrated at operation 210. At least one of the monomer species contains an EUV-absorbing element such as Sn, Te, Bi, or Sb. The difunctional EUV-absorbing monomers can be represented by the generic formulas $R_2MX_2$ or $R_3ZX_2$ where R represents a hydrocarbon ligand such as an alkyl (e.g., methyl, ethyl, propyl, butyl, cyclohexyl, etc.) or aryl (e.g., phenyl, tolyl, naphthyl, etc.) group, X represents an anionic group such as a hydride, halide, or dialkylazanide, M represents an EUV-absorbing element such as Sn or Te, and Z represents an EUV-absorbing element such as Sb or Bi. For example, the selected EUV-absorbing monomers may be difunctional compounds such as diphenyltin dihydride, bis(diethylamino)dimethyltin, diethyltin dichloride, dibutyltellurium diiodide, triphenylantimony(V) dichloride, diacetyloxy(triphenyl)bismuth, etc. While not illustrated herein, compounds containing EUV-absorbing elements other than Sn, Sb, Bi, or Te can be used in some embodiments. Further, the hydrocarbon R groups in a molecule of $R_2MX_2$ or $R_3MX_2$ may not be the same species of hydrocarbon in some embodiments.

Difunctional organic monomers such as dicarboxylic acids and diols can also be selected. Examples of dicarboxylic acids can include camphoric acid, 1,4-cyclohexanedicarboxylic acid, 2,3-norbornanedicarboxylic acid, bicyclo[2.2.2]octane-1,4-dicarboxylic acid, 1,3-adamantanedicarboxylic acid, 5,7-dimethyladamantane-1,3-dicarboxylic acid, 3-carboxyadamantane-1-acetic acid, 1,3-adamantanediacetic acid, terephthalic acid, p-phenylenediacetic acid, 1,4-phenylenedipropionic acid, 1,1'-ferrocenedicarboxylic acid, 1,1'-ferrocenedicacetic acid, and ferrocenyl dicarboxylic acid analogs wherein iron is replaced with Ru, V, Zr, Hf, Ti, or Sn. Examples of diols can include bisphenol A, hydroquinone, 4-(4-hydroxyphenyl)tellanylphenol, 1,4-biphenyldimethanol, 1,4-cyclohexanedimethanol, 1,4-cyclohexanediol, 4,4'-bicyclohexanol, tricyclodecanedimethanol, ferrocenyl diols (e.g., 1,1'-ferrocenedimethanol, 1,1'-ferrocenediethanol, etc.), and ferrocenyl diol analogs wherein iron is replaced with Ru, V, Zr, Hf, Ti, or Sn. However, as will be understood by persons of ordinary skill, a variety of diol or dicarboxylic acid monomers not illustrated herein can be used in some embodiments. Additionally, other difunctional organic monomers may be used (e.g., diamines) in some embodiments. It should be noted that, while some of the aforementioned organic monomers include metal or metalloid atoms, they are referred to herein as organic monomers to indicate that their inorganic atoms do not participate in the polymerization (e.g., polycondensation reactions).

The selected monomers are polymerized to form an alternating copolymer. This is illustrated at operation 220. The polymerization can be a polycondensation reaction. For example, alternating copolymers can be formed by reacting at least two different species of EUV-absorbing monomers (e.g., a bis(diethylamino)dialkyltin and a diaryltin dihydride). Alternating copolymers can also be formed from EUV-absorbing and organic monomers. For example, at least one species of difunctional EUV-absorbing monomer can be reacted with at least one species of difunctional organic monomer (e.g., a diol or dicarboxylic acid monomer). Example reactions to form polyether organotin alternating copolymers and polyester organotin alternating copolymers are discussed in greater detail with respect to FIGS. 4A and 4B. The amount of time, temperature, solvent, and other reaction conditions can depend upon the monomer species and scale of the reaction, as is understood by those of ordinary skill in the art. Examples of polymerization reactions are discussed in greater detail below.

Terminal units are affixed to the ends of the alternating copolymers to form alternating copolymer resists. This is illustrated at operation 230. A species of terminal unit selected at operation 210 can be dissolved in an appropriate solvent (e.g., depending on the monomer polarity, molecular mass/structure, etc.) and mixed with an alternating copolymer formed at operation 220. It should be noted that, while the terminal unit selection is illustrated at operation 210, the selection can happen any time prior to or at operation 230. Additionally, in some embodiments an alternating copolymer with live ends can be obtained from another source (e.g., a commercial source) rather than being formed at operation 220.

Terminal units may be selected from monofunctional compounds similar to the aforementioned examples of difunctional EUV-absorbing and/or organic monomers. The monofunctional EUV-absorbing terminal units can be represented by the generic formulas $R_3MX$ or $R_4ZX$ where, as in the case of the generic difunctional EUV-absorbing monomer formulas, R represents a hydrocarbon ligand, X represents an anionic group, M represents an EUV-absorbing element such as Sn or Te, and Z represents an EUV-absorbing element such as Sb or Bi.

Examples of monofunctional EUV-absorbing monomers used for terminal units can include, e.g., trimethyltin hydride, triethyltin hydride, tripropyltin hydride, tributyltin hydride (e.g., (n-Bu)$_3$SnH or (t-Bu)$_3$SnH)), triphenyltin hydride, trimethyltin diethylamide, triethyltin diethylamide, tripropyltin diethylamide, tri-n- or tri-t-butyltin diethylamide, trimethyltellurium iodide, tetraphenylantimony bromide, tetra-m-tolylbismuth iodide, tetramethylbismuth chloride, etc.

EUV-absorbing monomers and terminal units can be reacted (e.g., at operations 220 and 230) to form an alternating copolymer represented by the following generic structure:

where A is an EUV-absorbing element, x=2 or 3 depending on the valence of A, and R, R', R", and R''' are each hydrocarbon ligands. The repeat unit hydrocarbon ligands R and R' are not the same species of hydrocarbon, but the terminal hydrocarbon ligands R" and R''' can independently be the same species as R, R', or another hydrocarbon. Polymer structures and syntheses are discussed in greater detail below.

Examples of organic monomers used as terminal units can include monofunctional carboxylic acid monomers such as cyclohexanecarboxylic acid, 2-norbornanecarboxylic acid, bicyclo[2.2.2]octane-1-carboxylic acid, 1-adamantanecarboxylic acid, 3,5-dimethyladamantane-1-carboxylic acid, 1-adamantaneacetic acid, benzoic acid, phenylacetic acid, 3-phenylpropionic acid, etc. Additional examples can include ferrocenecarboxylic acid, ferroceneacetic acid, ferrocenepropionic acid, and analogs thereof where iron is replaced with Ru, V, Zr, Hf, Ti, or Sn. Examples of organic terminal units can also include monofunctional alcohols such as 4-phenyltellanylphenol, tricyclodecanemethanol, phenylmethanol, phenylethanol, phenylpropanol, 4-biphenylmethanol, ferrocenyl alcohols (e.g., ferrocenemethanol) and analogs thereof where iron is replaced with Ru, V, Zr, Hf, Ti, or Sn, 4-cyclohexylcyclohexanol, 4-phenylphenol, etc.

When organic monomers are included at operations 220 and 230, the alternating copolymer resist can be represented by the following generic structure:

where A is an EUV-absorbing element, x=2 or 3 depending on the valence of A, E is an organic monomer unit, E is an organic terminal unit, and R is a hydrocarbon ligand. For example, E can be a monohydroxy or monocarboxylic acid compound affixed to the polymer ends via condensation reaction. Examples of polymer structures and syntheses are discussed in greater detail with respect to FIGS. 3A-4B.

The alternating copolymer resists formed at operation 230 can be applied to a substrate. This is illustrated at operation 240. The substrate can be any appropriate substrate for lithographic patterning of a photoresist (e.g., a semiconductor wafer, an inorganic hardmask, a polymer brush-coated inorganic substrate, etc.). A variety of coating processes can be used to apply the resist. Examples of these coating processes can include spin coating, spray coating, dip coating, knife edge coating, printing approaches (e.g., ink jet or screen printing), spin casting, etc. The application can take place in a single coating step or multiple coating steps. Using multiple coating steps can provide greater control over the coating process. For example, a series of spin coatings can be used to provide a desired thickness, which can range from a few nanometers to a few microns. After the photoresist is coated onto the substrate, further heating and/or solvent evaporation steps may be carried out to harden the photoresist layer. In some embodiments, the thickness of the resist ranges from approximately 30 nm to 50 nm, though it can range from approximately 1 nm to 500 μm.

In some embodiments, however, process 200 omits operation 240. In other embodiments, additional steps can be carried out following the formation of the photoresist at operation 240. These steps are not illustrated in FIG. 2, but can include lithographic patterning with EUV light. A variety of EUV light sources can be used. EUV light sources for lithography generally have a high average power (e.g., 100 W or higher) at 2% bandwidth with a central wavelength of 13.5 nm. For example, a laser-driven tin (Sn) plasma with a high power drive laser having a wavelength less than approximately 1 μm can be employed. In some embodiments, the drive laser is a pulsed laser. However, the drive laser can also be a solid-state laser, gas-discharge laser, or excimer laser. It should also be noted that in some embodiments the patterning may be carried out with electron beam (e-beam) lithography or immersion photolithography, rather than EUV lithography. A photomask with the desired pattern is used to partially mask the alternating copolymer resist before exposure to the energy source. Exposing the photoresist to EUV light causes a photoinduced polymer chain scission reaction to occur in the unmasked sections of the photoresist.

Photolithographic processes involving the alternating copolymers with terminal units disclosed herein can be used in the fabrication of integrated circuit chips for use in electronic devices. These integrated circuit chips can be distributed by the fabricator as raw wafers, bare die, packaged in a single chip form (e.g., a plastic carrier with leads attached to a motherboard or other carrier), packaged in a multichip form (e.g., a ceramic carrier with surface interconnections and/or buried interconnections), etc. The chips can be integrated with other chips, circuit elements, signal processing devices, etc. Examples of end products that can contain the chip include computing devices (e.g., computer products including a display, keyboard or other input device, and processors), toys, appliances, automotive parts, etc. In addition to acting as chain scission resists, the alternating copolymer resists disclosed herein may be used to prevent biofouling on underwater surfaces, improve the performance of ion beam etching, etc. in some embodiments.

Figure 3A:
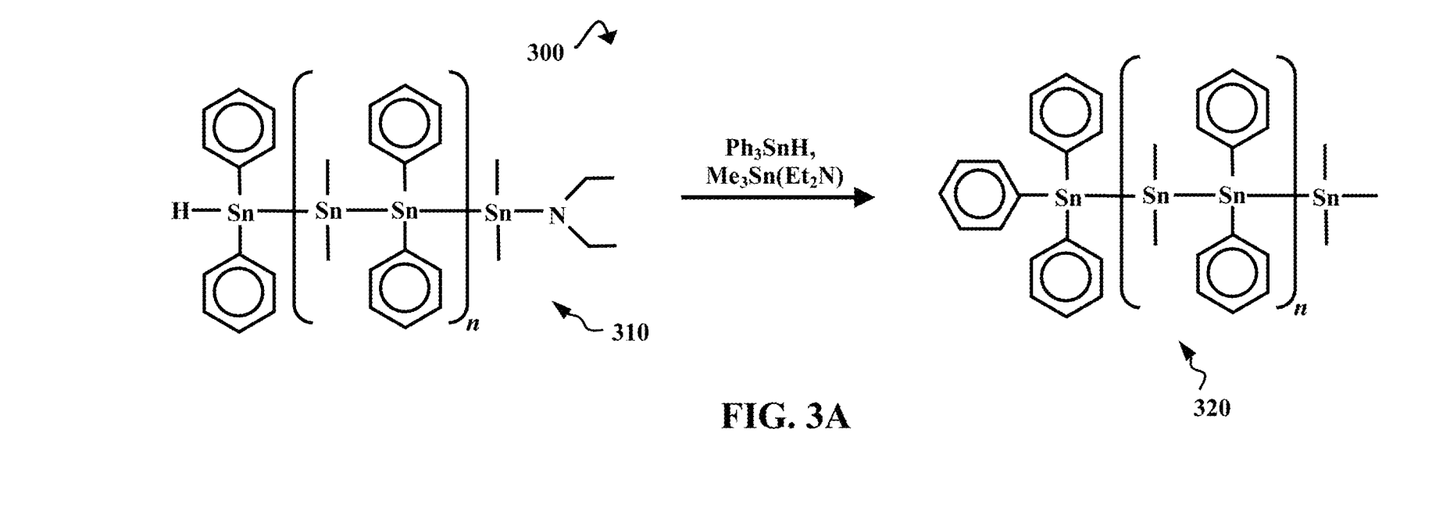
FIGS. 3A and 3B are chemical reaction diagrams illustrating processes of forming alternating copolymer resists from EUV-absorbing monomers, according to some embodiments of the present disclosure.
Figure 3B:
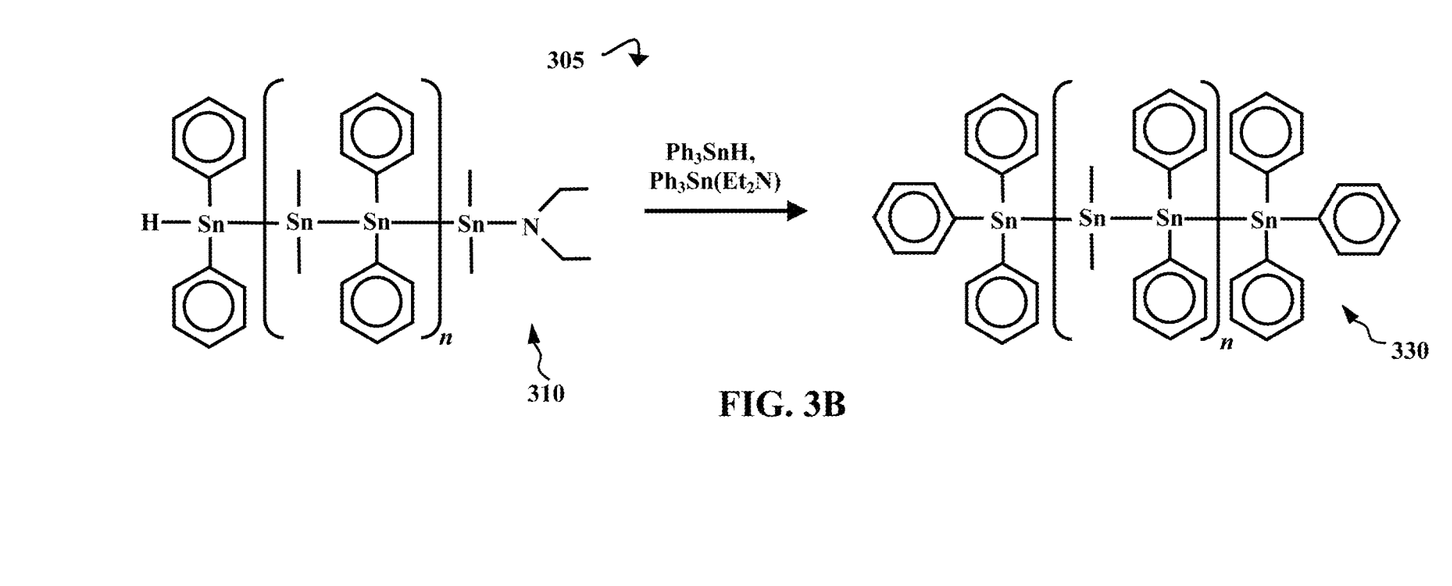

FIGS. 3A and 3B are chemical reaction diagrams illustrating processes 300 and 305 of forming alternating copolymer resists from EUV-absorbing monomers, according to some embodiments of the present disclosure. Process 300 begins with obtaining an alternating copolymer 310 from two species of difunctional organotin monomers. Alternating copolymer 310 can be obtained using any appropriate synthetic methods, although alternating copolymer 310 may also be obtained from another source (e.g., a commercial source) in some embodiments. An example synthesis (not shown) of alternating copolymer 310 can include a polycondensation reaction between difunctional organotin monomers, diphenyltin dihydride ($Ph_2SnH_2$) and bis(diethylamino)dimethyltin ($Me_2Sn(Et_2N)_2$). Approximately equimolar amounts of $Me_2Sn(Et_2N)_2$ and $Ph_2SnH_2$ can be combined in a mixture of solvents such as diethyl ether ($Et_2O$) and toluene. The mixture is allowed to react (e.g., while stirring) at about 0° C. for about 3 hours, substantially in the absence of light and oxygen (e.g., shielded from ambient light and in a reaction container maintained under an argon or nitrogen atmosphere). The reaction forms the illustrated alternating copolymer 310 (—[$Ph_2Sn$-alt-$Me_2Sn$]$_n$— with hydride and diethylamino functional end groups). Similar reaction conditions can be used to form alternating copolymers from other difunctional EUV-absorbing monomers, as will be understood by persons of ordinary skill in the art.

Terminal units are affixed at the ends of alternating copolymer 310 to form alternating copolymer resist 320. In process 300, two species of monofunctional organotin monomer, triphenyltin hydride ($Ph_3SnH$) and trimethyltin diethylamide ($Me_3SnNEt_2$), are used. For example, at least two equivalents (based on the approximate number of alternating copolymer chains) of monofunctional organotin monomers can be mixed with alternating copolymer 310. In some embodiments, $Ph_3SnH$ and $Me_3SnNEt_2$ can be combined with alternating copolymer 310 in $Et_2O$/toluene at about 0° C. This reaction results in alternating copolymer resist 320, which has two species of terminal units, triphenyltin and trimethyltin.

In process 305 (FIG. 3B), at least two equivalents (based on the approximate number of alternating copolymer chains) of monofunctional organotin monomers having the same R groups, triphenyltin diethylamide ($Ph_3Sn(Et_2N)$) and $Ph_3SnH$, are mixed with alternating copolymer 310. This reaction can be carried out using conditions substantially similar to those of process 300, but result in an alternating copolymer resist 330 having symmetrical triphenyltin terminal units. Similarly, an alternating copolymer resist having symmetrical trimethyl terminal units (not shown) can be formed by reacting alternating copolymer 310 with, e.g., $Me_3Sn(Et_2N)$ and trimethyltin hydride ($Me_3SnH$). In some embodiments, at least one terminal unit can be replaced with another trifunctional organotin monomer (e.g., tributyltin hydride).

Figure 4A:
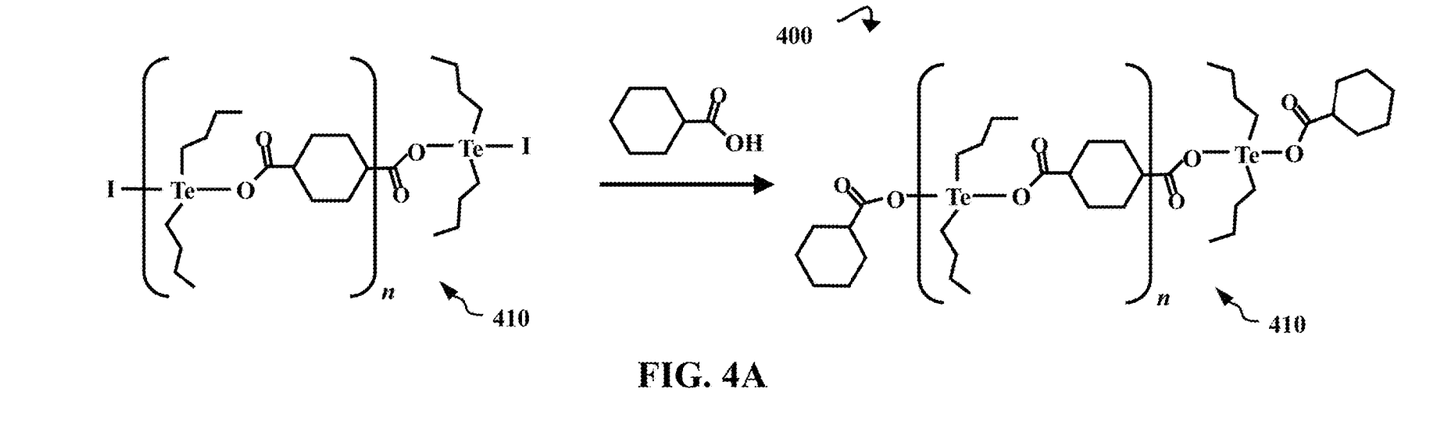
FIGS. 4A and 4B are chemical reaction diagrams illustrating processes of forming alternating copolymer resists from EUV-absorbing and organic monomers, according to some embodiments of the present disclosure.
Figure 4B:
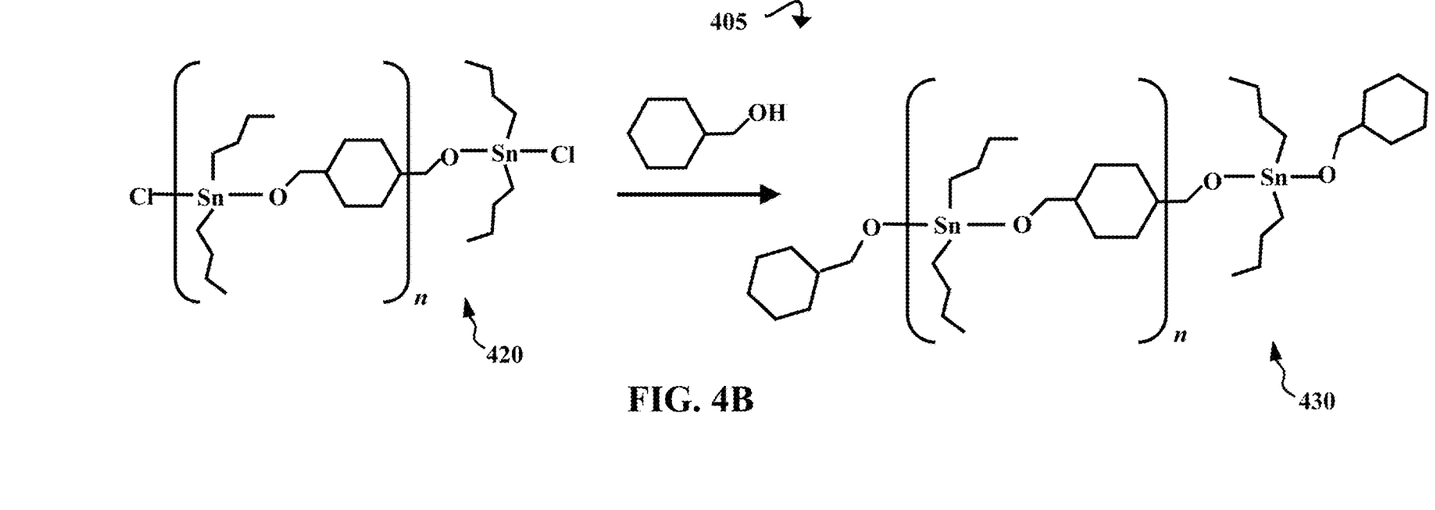

FIGS. 4A and 4B are chemical reaction diagrams illustrating processes 400 and 405 of forming alternating copolymer resists from EUV-absorbing and organic monomers, according to some embodiments of the present disclosure. Process 400 (FIG. 4A) begins with obtaining a polyester organotellurium alternating copolymer 410 from a difunctional organotellurium monomer, di-n-butyltellurium diiodide (n-$Bu_2TeI_2$), and a dicarboxylic acid monomer, 1,4-cyclohexanedicarboxylic acid. Process 405 (FIG. 4B) begins with obtaining a polyether organotin alternating copolymer 420 from a difunctional organotin monomer, $Bu_2SnCl_2$, and a diol monomer, 1,4-cyclohexanedimethanol. Alternating copolymers 410 and 420 can be obtained using any appropriate synthetic methods (see below), although alternating copolymers 410 and/or 420 may also be obtained from another source (e.g., a commercial source) in some embodiments.

Referring to FIG. 4A, an example synthesis (not shown) of alternating copolymer 410 can include dissolving 1,4-cyclohexanedicarboxylic acid and a base such as sodium hydroxide (NaOH) in water. An approximately equimolar amount of $Bu_2TeI_2$ dissolved in an organic solvent such as heptane can be added to the 1,4-cyclohexanedicarboxylic acid solution. The resulting mixture can be stirred/agitated for about one minute or less (e.g., between about 20 seconds-1 minute). However, the reaction can be allowed to proceed for any appropriate length of time (e.g., about 1 minute to an hour or longer).

Referring to FIG. 4B, an example synthesis (not shown) of alternating copolymer 420 can include dissolving 1,4-cyclohexanedimethanol in water. In some embodiments, a base such as NaOH can be added to the aqueous solution. The resulting mixture can be stirred/agitated for about one minute or less (e.g., between about 20 seconds-1 minute). However, the reaction can be allowed to proceed for any appropriate length of time (e.g., about 1 minute to an hour or longer).

In processes 400 and 405, terminal units are affixed to alternating copolymers 410 and 420, respectively, by adding monofunctional organic monomers. In process 400 (FIG. 4A), a monofunctional alcohol, cyclohexanemethanol, is mixed with alternating copolymer 410. This results in alternating copolymer resist 430, which has ester-linked cyclohexane terminal units. In process 405 (FIG. 4B), a monofunctional carboxylic acid monomer, cyclohexanecarboxylic acid, is mixed with alternating copolymer 420. This results in alternating copolymer resist 440, which has ether-linked methylcyclohexane terminal units. As will be understood by persons of ordinary skill, processes 400 and 405 can be modified to by substituting different species of monofunctional alcohols and carboxylic acids, resulting in analogous alternating copolymer resists having different terminal units. Examples of monofunctional organic monomers that can be used are discussed in greater detail with respect to FIG. 2. In some embodiments (not shown), monofunctional EUV-absorbing monomers (e.g., tributyltin chloride, tributyltellurium iodide, tetramethylantimony iodide, etc.) can replace the monofunctional carboxylic acid and alcohol monomers as terminal units.

In some embodiments, compounds disclosed herein can have additional moieties such as epoxides, hydroxyl, propylene carbonate, alkyl halides, esters, alkynes, amines, isocyanates, acid chlorides, chloroformates, thiols, oxiranes, silyls, carboxylic acids, alkoxyls, alkyls, etc. Herein, "alkyl" refers to $C_1$-$C_{100}$ radicals, which can be linear, branched, or cyclic. Examples of alkyl groups can include methyl, ethyl, n-propyl, iso-propyl, n-butyl, iso-butyl, sec-butyl, tert-butyl, pentyl, hexyl, octyl, cyclopropyl, cyclobutyl, cyclopentyl, cyclohexyl, and cyclooctyl.

The compounds described herein can contain one or more chiral centers. Unless otherwise noted, the disclosed structures cover all stereoisomers, conformers, rotamers, isomers, and enantiomers of the represented compounds. Further, polymers or other materials containing the disclosed compounds can include racemic forms of the compounds in addition to individual stereoisomers, as well as mixtures containing any of these. Substituents on the compounds described herein may participate in additional chemical reactions, transformations, or interactions, which can include synthesis; decomposition; single and/or double replacement reactions, oxidation/reduction reactions, acid/base reactions, nucleophilic-, electrophilic-, or radical-substitution reactions, addition/elimination reactions, crosslinking reactions, and/or polymerization reactions.

Where isomers of a named alkyl, alkenyl, alkoxy, aryl, or other functional group exist (e.g., n-butyl, iso-butyl, sec-butyl, and tert-butyl), reference to a member of the group without specifying a particular isomer (e.g., butyl) is intended to include all isomers in the family (e.g., n-butyl, iso-butyl, sec-butyl, and tert-butyl). Further, unless specified otherwise, reference to one member of the group (e.g., n-butyl) can include the remaining isomers in the family (e.g., iso-butyl, sec-butyl, and tert-butyl). This can depend on steric or other properties of the isomers, as will be understood by persons of ordinary skill.

Unless otherwise noted, chemical reactions are performed at ambient conditions or under slight heating with no special atmosphere or head space, and may be performed using standard organic solvents to manage mix properties such as viscosity and flow index. Standard procedures for quenching reactions, solvent removal, and purification are performed. Room temperature is between about 15° C. and 30° C. unless otherwise indicated. Ranges (e.g., time, concentration, temperature, etc.) indicated herein include both endpoints and all numbers between the endpoints. Unless specified otherwise, the use of "about," "approximately," or a tilde (~) in connection with a range applies to both ends of the range (e.g., "approximately 1 g-5 g" should be interpreted as "approximately 1 g-approximately 5 g"), and in connection with a list of ranges applies to each range in the list (e.g., "about 1 g-5 g, 5 g-10 g, etc." should be interpreted as "about 1 g-about 5 g, about 5 g-about 10 g, etc."). Unless otherwise indicated, modifying terms such as "about," "approximately," and "~" indicate +/−10% of a recited value, range of values, or endpoints of one or more ranges of values.

The processes discussed herein, and their accompanying drawings, are not to be construed as limiting. One skilled in the art would recognize that a variety of techniques may be used that vary in conditions, components, methods, etc., which ultimately generate alternating copolymer resists. In addition, the conditions can optionally be changed over the course of a process. Further, in some embodiments processes can be added, omitted, or carried out in alternate orders, while still remaining within the scope of the disclosure, as will be understood by a person of ordinary skill in the art. It should also be noted that processes can be carried out by a single entity, or by multiple entities. For example, a first entity may prepare the alternating copolymers, a second entity may prepare the resists therefrom, and a third entity may carry out EUV lithography using the resists.

What is claimed is:

1. A process of forming a polymer resist, comprising:
providing an alternating copolymer having repeat units each comprising an ultraviolet (EUV)-absorbing element A; and
reacting end groups of the alternating copolymer with monofunctional monomers selected from the group consisting of trimethyltin hydride, triethyltin hydride, tripropyltin hydride, tributyltin hydride, triphenyltin hydride, trimethyltin diethylamide, triethyltin diethylamide, tripropyltin diethylamide, tri-n-butyltin diethylamide, tri-t-butyltin diethylamide, trimethyltellurium iodide, tetraphenylantimony bromide, tetra-m-tolylbismuth iodide, and tetramethylbismuth chloride to form a polymer having the following structure:

wherein:
n is an integer greater than 1
x=2 or 3; and
R, R', R", and R'" are each hydrocarbon ligands.

2. The process of claim 1, wherein the providing comprises a polymerization reaction between two different species of difunctional EUV-absorbing monomers.

3. The process of claim 1, further comprising:
applying the polymer resist on a substrate; and
lithographically patterning the polymer resist.

4. The process of claim 1, wherein R is not the same species of hydrocarbon as R'.

5. The process of claim 1, wherein A is selected from the group consisting of Sn, Te, Bi, and Sb.

6. The process of claim 1, wherein the R" is the same species of hydrocarbon as the R'.

7. The process of claim 1, wherein the R is the same species of hydrocarbon as the R'".

8. The process of claim 1, wherein the R" is the same species of hydrocarbon as the R'".

9. The process of claim 1, wherein a chain length of the polymer is controlled by the reacting the end groups with the monofunctional monomers.

* * * * *